United States Patent
Chen

(10) Patent No.: US 8,860,202 B2
(45) Date of Patent: Oct. 14, 2014

(54) CHIP STACK STRUCTURE AND MANUFACTURING METHOD THEREOF

(75) Inventor: Shih-Hung Chen, Jhudong Township, HsinChu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/597,669

(22) Filed: Aug. 29, 2012

(65) Prior Publication Data
US 2014/0061947 A1   Mar. 6, 2014

(51) Int. Cl.
*H01L 23/02* (2006.01)

(52) U.S. Cl.
USPC ............. 257/686; 257/E23.085; 257/685; 257/777; 438/108; 438/109; 361/760

(58) Field of Classification Search
CPC .............. H01L 25/0657; H01L 2924/15311; H01L 2224/48091
USPC ......... 257/E23.085, E25.017, 685, 686, 723, 257/777, 778, E21.499, E23.141; 438/108, 438/109; 361/760
See application file for complete search history.

(56) References Cited

U.S. PATENT DOCUMENTS

| | | | | |
|---|---|---|---|---|
| 6,137,163 A * | 10/2000 | Kim et al. | ...................... | 257/686 |
| 6,469,374 B1 * | 10/2002 | Imoto | ........................... | 257/686 |
| 6,582,991 B1 * | 6/2003 | Maeda et al. | ................. | 438/107 |
| 6,646,334 B2 * | 11/2003 | Hur | ............................... | 257/686 |
| 7,102,227 B2 * | 9/2006 | Terui | ............................ | 257/724 |
| 7,205,670 B2 * | 4/2007 | Oyama | ......................... | 257/778 |
| 7,284,311 B2 * | 10/2007 | Nakamura | ...................... | 29/593 |
| 7,673,387 B2 * | 3/2010 | Tuominen et al. | ............. | 29/852 |
| 7,768,795 B2 * | 8/2010 | Sakurai et al. | ................ | 361/790 |
| 7,843,059 B2 * | 11/2010 | Gomyo et al. | ................ | 257/723 |
| 7,847,413 B2 * | 12/2010 | Akiba et al. | .................. | 257/777 |
| 7,919,336 B2 * | 4/2011 | Shizuno | .......................... | 438/15 |
| 8,039,943 B2 * | 10/2011 | Harayama et al. | ............ | 257/686 |
| 8,058,717 B2 * | 11/2011 | Takano | ......................... | 257/686 |
| 8,138,021 B2 * | 3/2012 | Corisis et al. | ................. | 438/108 |
| 8,202,763 B2 * | 6/2012 | Meyer et al. | .................. | 438/108 |
| 2003/0162326 A1 * | 8/2003 | Tsubosaki et al. | ............ | 438/109 |
| 2006/0278967 A1 * | 12/2006 | Tuominen et al. | ............ | 257/686 |
| 2007/0084628 A1 * | 4/2007 | Chang et al. | .................. | 174/260 |
| 2007/0132082 A1 * | 6/2007 | Tang et al. | .................... | 257/686 |
| 2008/0290492 A1 * | 11/2008 | Chung et al. | .................. | 257/686 |
| 2010/0052187 A1 * | 3/2010 | Lee et al. | ....................... | 257/777 |
| 2010/0213603 A1 * | 8/2010 | Smeys et al. | .................. | 257/698 |
| 2010/0246141 A1 * | 9/2010 | Leung et al. | .................. | 361/735 |

* cited by examiner

*Primary Examiner* — Chris Chu
(74) *Attorney, Agent, or Firm* — McClure, Qualey & Rodack, LLP

(57) ABSTRACT

A chip stack structure and a manufacturing method thereof are provided. The chip stack structure comprises a first chip, a second chip and a vertical conductive line. The second chip is disposed above the first chip. The vertical conductive line is electrically connected to the first chip and the second chip. The vertical conductive line is disposed at the outside of a projection area of the first chip and the second chip.

6 Claims, 9 Drawing Sheets

CHIP STACK STRUCTURE AND MANUFACTURING METHOD THEREOF

BACKGROUND OF THE INVENTION

1. Field of the Invention

The invention relates in general to a stack structure and manufacturing method thereof, and more particularly to a chip stack structure and manufacturing method thereof.

2. Description of the Related Art

With the development of semiconductor technology, varied semiconductor elements have been invented. For example, semiconductor elements include memory, microprocessor, sensing chip and MEMS. The semiconductor elements have different functions. Some semiconductor elements are disposed on a package substrate to be formed a semiconductor package. Each semiconductor package is soldered and disposed on a printed circuit board, such that those semiconductor elements can perform varied functions thereof.

Because the current trend of electric product is towards "light, thin, short and small", the electric product is getting smaller and smaller. For reducing the volume of the electric product, the package technology is improved for reducing the volume of the semiconductor package.

SUMMARY OF THE INVENTION

The invention is directed to a chip stack structure and a manufacturing method thereof. A vertical conductive line disposed at the outside of a projection area of chips is used to form the chip stack structure.

According to a first aspect of the present invention, a chip stack structure is provided. The chip stack structure comprises a first chip, a second chip and a vertical conductive line. The second chip is disposed above the first chip. The vertical conductive line is electrically connected to the first chip and the second chip. The vertical conductive line is disposed at the outside of a projection area of the first chip and the second chip.

According to a second aspect of the present invention, a manufacturing method of a chip stack structure is provided. The manufacturing method of the chip stack structure comprises the following steps. A first chip is provided. A second chip is provided. The first chip and the second chip are stacked. A vertical conductive line for electrically connecting the first chip and the second chip is formed. The vertical conductive line is disposed at the outside of a projection area of the first chip and the second chip.

The invention will become apparent from the following detailed description of the preferred but non-limiting embodiments. The following description is made with reference to the accompanying drawings.

DETAILED DESCRIPTION OF THE INVENTION

Preferred embodiments are disclosed below for elaborating the invention. A vertical conductive line disposed at the outside of a projection area of chips is used to form a chip stack structure. The following embodiments are for the purpose of elaboration only, not for limiting the scope of protection of the invention. Besides, secondary elements are omitted in the following embodiments to highlight the technical features of the invention.

First Embodiment

Figure 1:
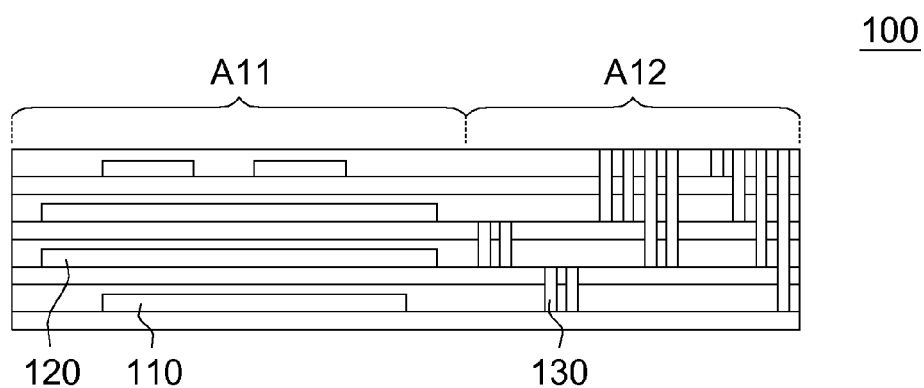
FIG. 1 shows a chip stack structure.

Please referring to FIG. 1, a chip stack structure 100 is shown. The chip stack structure 100 includes at least two chips, such as a first chip 110 and a second chip 120, and at least a vertical conductive line, such as vertical conductive line 130. The second chip 120 is disposed above the first chip 110. The vertical conductive line 130 is electrically connected to the first chip 110 and the second chip 120. The vertical conductive line 130 is disposed at the outside of a projection area of the first chip 110 and the second chip 120.

In the present embodiment, the first chip 110 and the second chip 120 is not electrically connected by wire bonding or by forming a through-silicon via (TSV) on the first chip 110 or the second chip 120. In the present embodiment, the first chip 110 and the second chip 120 are electrically connected by the vertical conductive line 130 disposed at the outside of the projection area of the first chip 110 and the second chip 120. Referring to FIG. 1, the first chip 110 and the second chip 120 are disposed at a chip area A11, and the vertical conductive line 130 is disposed at a line area A12. The line area A12 can be four edges or one edge of the chip stack structure 100. The vertical conductive line 130 is disposed at outside of the chip area A11, such that the first chip 110 and the second chip 120 can be gathered at the chip area A11. Therefore, the horizontal distance and the vertical distance between the first chip 110 and the second chip 120 can be reduced, and the current path of the vertical conductive line 130 can be reduced.

Figure 2:
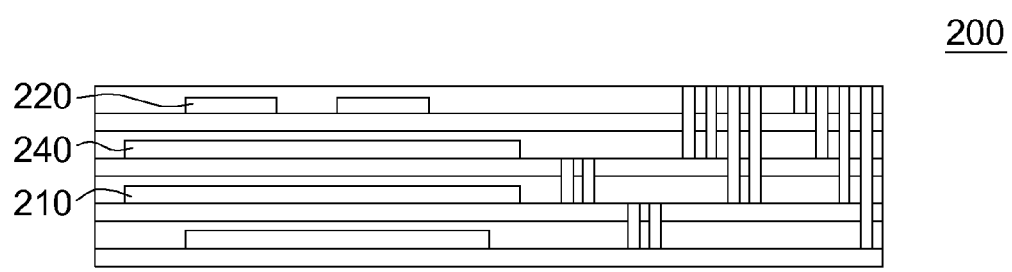
FIG. 2 shows another chip stack structure.

Please referring to FIG. 2, another chip stack structure 200 is shown. A heat sink plate 240 can be disposed between the first chip 210 and the second chip 220. The heat sink plate 240 can diffuse the heat while the first chip 210 and the second chip 220 are working. The heat sink plate 240 can be an aluminum plate or a casing including fluid.

Figure 3:
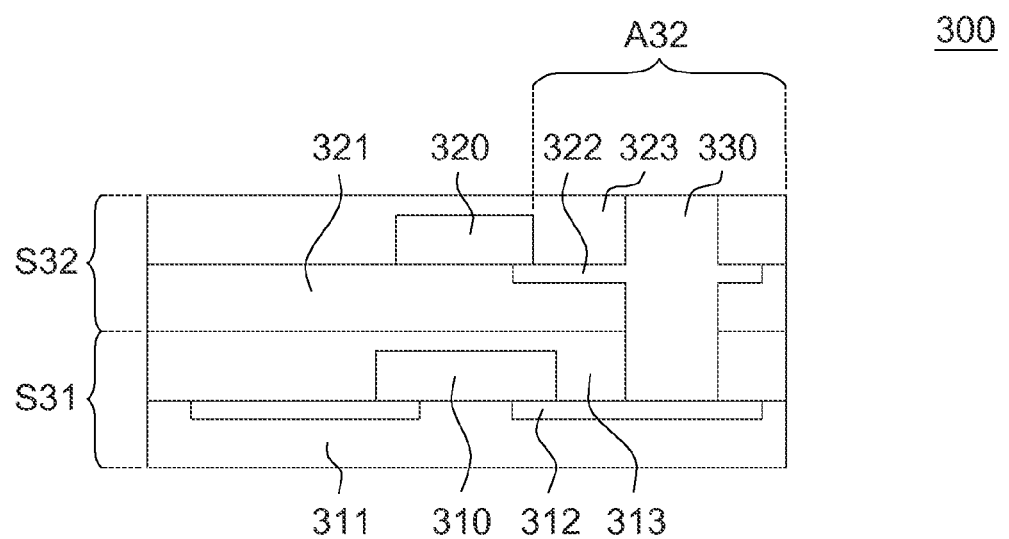
FIG. 3 shows two stacks of another chip stack structure in detail.

Please referring to FIG. 3, two stacks S31, S32 of another chip stack structure 300 are shown. The chip stack structure 300 includes a first chip 310, a first substrate 311, a first horizontal conductive line 312, a first insulating layer 313, a second chip 320, a second substrate 321, a second horizontal conductive line 322, a second insulating layer 323 and a vertical conductive line 330. The chip stack structure 300 can includes more than two stacks. In FIG. 3, two stacks S31, S32 are shown for example. The first chip 310, the first substrate 311, the first horizontal conductive line 312 and the first insulating layer 313 form the bottom stack S31. The second chip 320, the second substrate 321, the second horizontal conductive line 322 and the second insulating layer 323 form the bottom stack S32. Other stacks similar to the stacks S32 can be disposed above the stack S31.

The first chip 310 and the second chip 320 can be microprocessor, memory, radio frequency chip, display chip or MEMS, for example. The first chip 310 and the second chip 320 can be the same kinds of chips or different kinds of chips. The size of the first chip 310 and the second chip 320 can be the same or different.

The first substrate 311 and the second substrate 321 are used for carrying varied electric components, such as the first chip 310 and the second chip 320. The material of the first substrate 311 and the second substrate 321 can be silicon, polymer or silicon oxide. The first chip 310 is disposed on the first substrate 311, and the second chip 320 is disposed on the second substrate 321.

The first horizontal conductive line 312 and the second horizontal conductive line 322 are used for transmitting electric signal. The material of the first horizontal conductive line 312 and the second horizontal conductive line 322 can be Cu, Ag, Ag or Al, for example. The first horizontal conductive line 312 is disposed in the first substrate 311, and the second horizontal conductive line 322 is disposed in the second substrate 321. The first horizontal conductive line 312 connects the first chip 310 and the vertical conductive line 330, and the second horizontal conductive line 322 connects the second chip 320 and the vertical conductive line 330. The first horizontal conductive line 312 and the second horizontal conductive line 322 can be exposed at the surfaces of the first substrate 311 and the second substrate 321 respectively. Or, the first horizontal conductive line 312 and the second horizontal conductive line 322 can be partially embedded in the first substrate 311 and the second substrate 321 respectively, and extend to the surfaces of the first substrate 311 and the second substrate 321.

The first insulating layer 313 covers the first substrate 311 and the first chip 310. The second insulating layer 323 covers the second substrate 321 and the second chip 320. The material of the first insulating layer 313 and the second insulating layer 323 can be polymer or silicon oxide. The first insulating layer 313 and the second insulating layer 323 are used for protecting the first chip 310 and the second chip 320. Moreover, the surface of the first insulating layer 313 is flat, such that the second substrate 321 can be stably stacked on the first insulating layer 313. The second insulating layer 323 is flat too, such that other substrate can be stably stacked on the second insulating layer 323.

The material of the first substrate 311, the second substrate 321, the first insulating layer 313 and the second insulating layer 323 can be the same. For example, the material of those elements can be polymer, or the material of those elements can be silicon oxide. Or, the material of the first substrate 311, the second substrate 321, the first insulating layer 313 and the second insulating layer 323 can be different. For example, the material of the first substrate 311 can be silicon, the material of the second substrate 321 can be silicon oxide, and the first insulating layer 313 and the second insulating layer 323 can be polymer.

The vertical conductive line 330 penetrates the second insulating layer 323, the second substrate 321 and the first insulating layer 313, but the vertical conductive line 330 does not penetrate the first substrate 311. The first horizontal conductive line 312 and the second horizontal conductive line 322 are both extend to the line area A32. The vertical conductive line 330 penetrates the line area A32 and connects the first horizontal conductive line 312 and the second horizontal conductive line 322 for electrically connecting the first chip 310 and the second chip 320.

Moreover, referring to FIG. 3, the size of the first substrate 311 is substantially equal to that of the second substrate 321, the first insulating layer 313 and the second insulating layer 323. The size of the first chip 310 can be different from that of the second chip 320. No matter the size of the first chip 310 and the size of the second chip 320, the size of the chip stack structure 300 can be fixed.

Figure 4A:
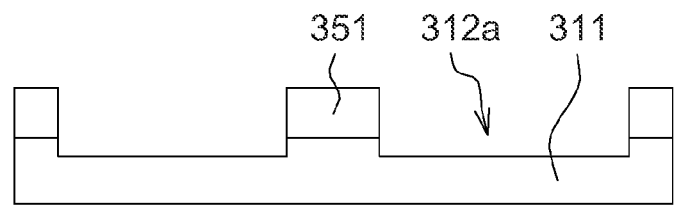
FIGS. 4A to 4K show a manufacturing method of a chip stack structure.
Figure 4B:
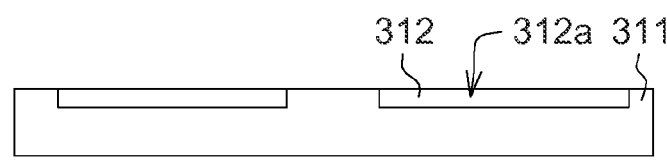
Figure 4C:
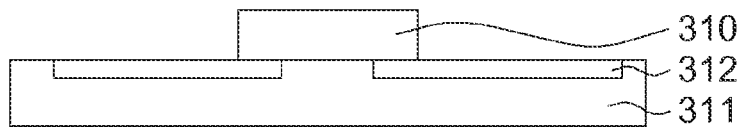
Figure 4D:
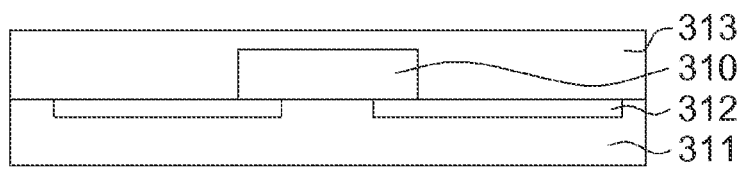
Figure 4E:
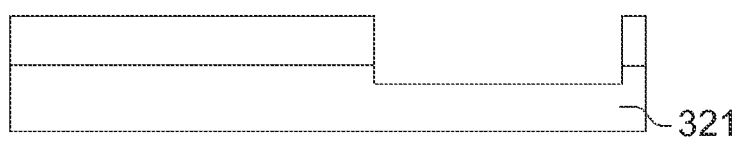
Figure 4F:
Figure 4G:
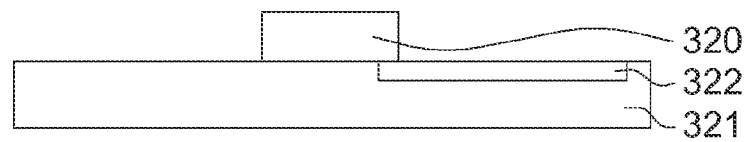
Figure 4H:
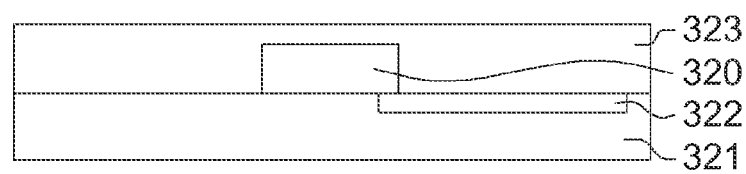
Figure 4I:
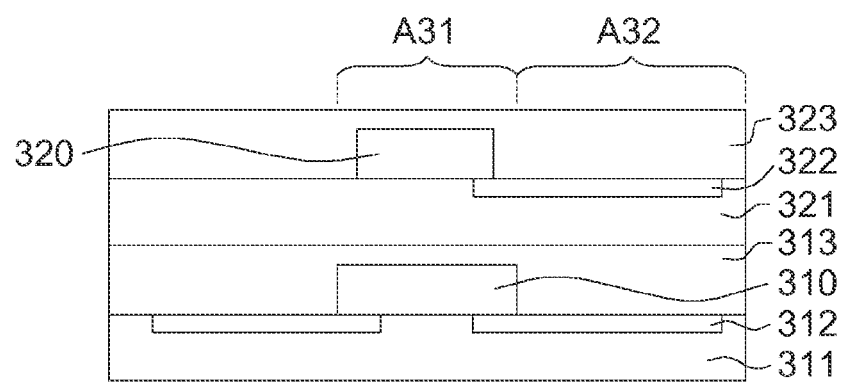
Figure 4J:
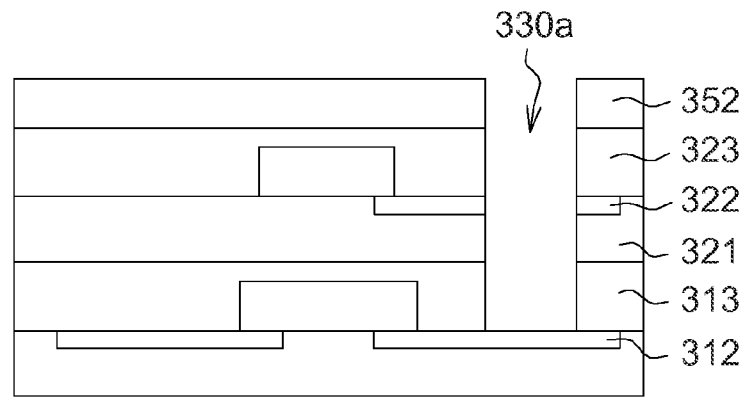
Figure 4K:
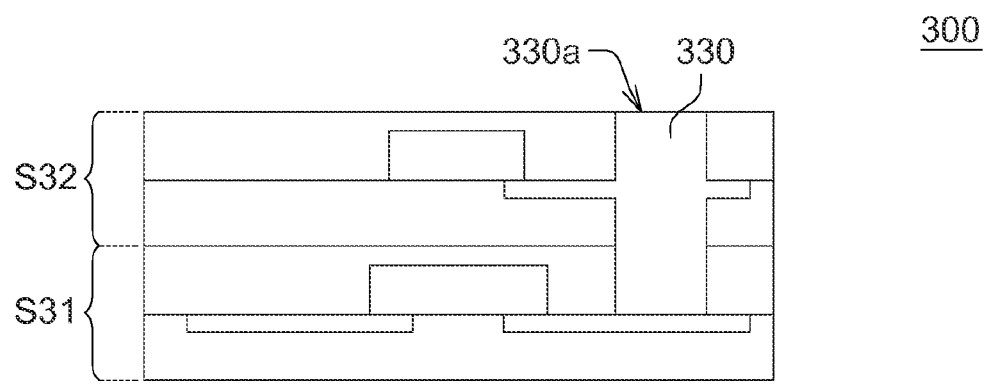

Furthermore, please referring to FIGS. 4A to 4K, a manufacturing method of the chip stack structure 300 is shown. As shown in FIGS. 4A to 4D, the first chip 310 is provided. As shown in FIGS. 4E to 4H, the second chip 320 is provided. As shown in FIG. 4I, the first chip 310 and the second chip 320 are stacked. As shown in FIGS. 4J to 4K, the vertical conductive line 330 is formed for electrically connecting the first chip 310 and the second chip 320. The vertical conductive line 330 is disposed at the outside of the projection area of the first chip 310 and the second chip 320.

In detail, referring to FIG. 4A, the first substrate 311 is provided, and the first substrate 311 is etched to form at least a concave 312a by taking a patterned photo-resister layer 351 as a mask.

Referring to FIG. 4B, the patterned photo-resister layer 351 is removed and the first horizontal conductive line 312 is formed in the concave 312a of the first substrate 311.

Referring to FIG. 4C, the first chip 310 is disposed on the first substrate 311. The first chip 310 connects the first horizontal conductive line 312. In this step, the first chip 310 can disposed on the first substrate 311 by a manner of flip chip bonding.

Referring to FIG. 4D, the first insulating layer 313 is formed to cover the first substrate 311 and the first chip 310. In this step, the first insulating layer 313 is flatted. For example, the first insulating layer 313 can be formed by spin coating, or by chemical mechanical polishing (CMP) after depositing, such that the surface of the first insulating layer 313 is flat.

Figure 5:
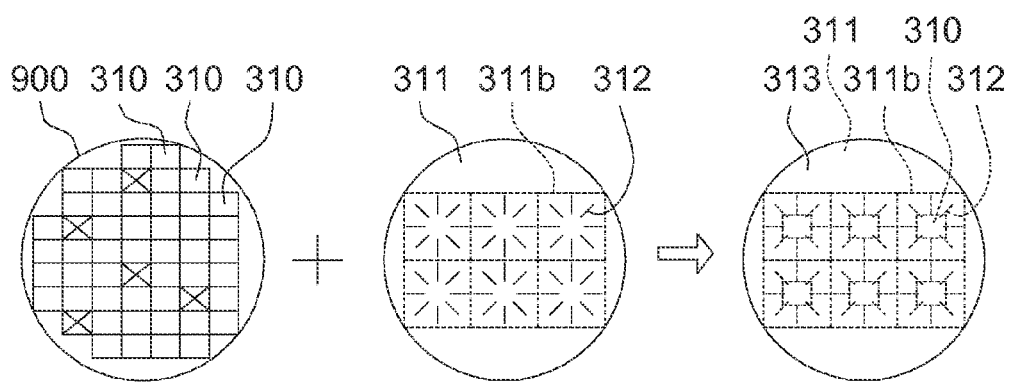
FIG. 5 shows the steps in FIGS. 4A to 4D performed by wafer level process.

The steps in FIGS. 4A to 4D can performed by chip level process or wafer level process. Please referring to FIG. 5, the steps in FIGS. 4A to 4D performed by wafer level process are shown. In the wafer process, as shown in the left part of FIG. 5, the wafer 900 can be cut into a plurality of first chip 310. After the wafer 900 is cut, good first chips 310 can be selected. Therefore, the yield rate can be improved. As shown in the central part of FIG. 5, the first substrate 311 can be round shaped. The first substrate 311 can be marked a plurality of cutting areas 311b. The first horizontal conductive line 312 can be formed in each cutting area 311b. As shown in the right part of FIG. 5, each first chip 310 is disposed on each cutting area 311b of the first substrate 311. Then, the first insulating layer 313 is formed on whole of the first substrate 311. Due to the covering by the first insulating layer 313, the first substrate 311, the first chip 310 and the first horizontal conductive line 312 are shown as dotted lines. Afterwards, the cutting areas 311b are cut. Therefore, the manufacturing speed can be increased by the wafer level process.

Afterwards, referring to FIGS. 4E to 4H, the second substrate 321, the second horizontal conductive line 322, the second chip 320 and the second insulating layer 323 are formed by several steps similar to the steps in FIGS. 4A to 4D.

Then, referring to FIG. 4I, the second substrate 321, the second horizontal conductive line 322, the second chip 320 and the second insulating layer 323 formed in FIGS. 4E to 4H are stacked on the first substrate 311, the first horizontal conductive line 312, the first chip 310 and the first insulating layer 313 formed in FIGS. 4A to 4D. In the step of stacking, the first chip 310 and the second chip 320 are not needed to be aligned accurately. It is only needed to overlap the first chip 310 and the second chip 320 to reduce the chip area A31 and result a big line area A32.

Afterwards, referring to FIG. 4J, the second insulating layer 323, the second horizontal conductive line 322, the second substrate 321 and the first insulating layer 313 are etched by taking a patterned photo-resist layer 352 as a mask to form a vertical hole 330a and expose the first horizontal conductive line 312.

Then, referring to FIG. 4K, the vertical conductive line 330 is formed in the vertical hole 330a, such that the vertical conductive line 330 electrically connects the first horizontal conductive line 312 and the second horizontal conductive line 322.

The chip stack structure 300 can be formed by the steps in FIGS. 4A to 4K. Only two stacks S31, S32 are taken as an example in FIGS. 4A to 4K. However, more than two stacks can be formed by the similar steps.

Figure 6:
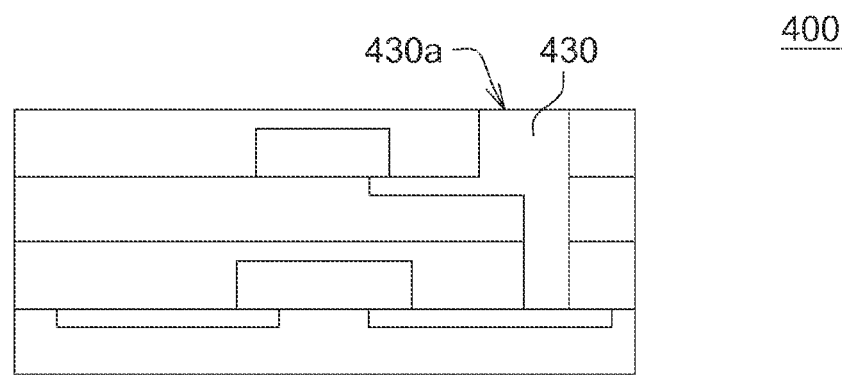
FIG. 6 shows another chip stack structure.

Please referring to FIG. 6, another chip stack structure 400 is shown. In the step of forming the vertical conductive line 430, a vertical hole 430a whose width is not the same at different locations is formed by more than one steps. Therefore, the width of the vertical conductive line 430 can be different at different locations.

Figure 7:
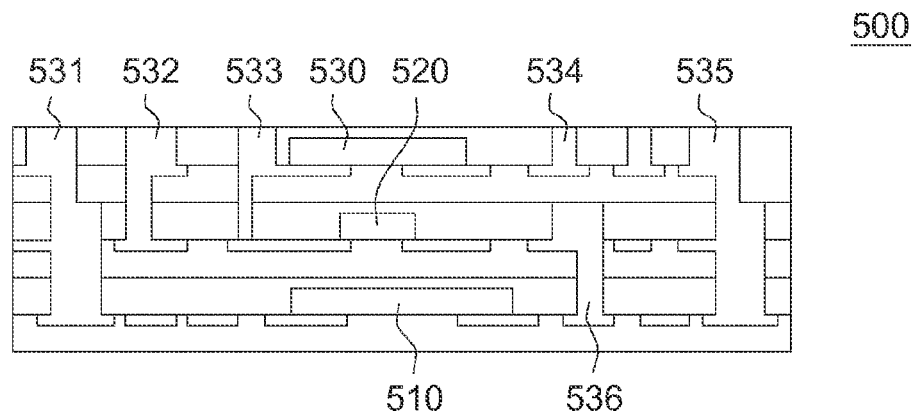
FIG. 7 shows another chip stack structure.

Please referring to FIG. 7, another chip stack structure 500 is shown. In one application, the chip stack structure 500 includes several vertical conductive lines 531, 532, 534, 535, 536. The vertical conductive line 531 can be a data line of the first chip 510, the second chip 520 and the third chip 530; the vertical conductive line 532 can be a power line of the second chip 520; the vertical conductive line 533 can be a data line of the second chip 520 and the third chip 530; the vertical conductive line 534 can be a power line of the third chip 530; the vertical conductive line 535 can be a power line of the first chip 510; the vertical conductive line 536 can be a data line of the first chip 510 and the second chip 520.

Second Embodiment

Figure 8:
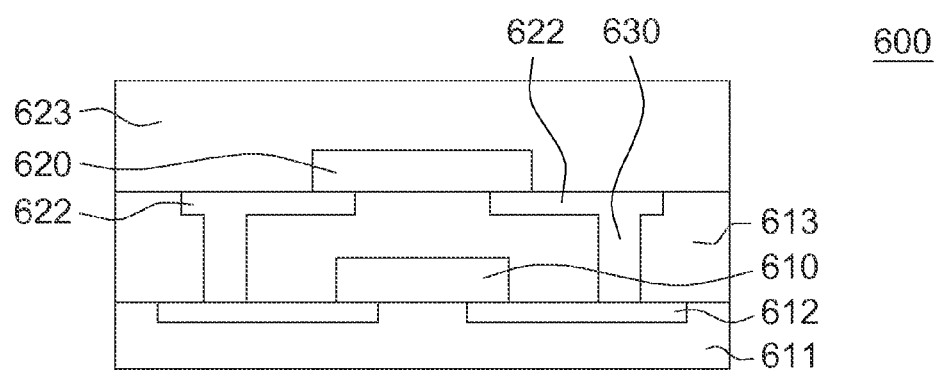
FIG. 8 shows another chip stack structure.

Please referring to FIG. 8, another chip stack structure 600 is shown. The chip stack structure 600 of the present embodiment is different from the chip stack structure 300 in that only one substrate 611 is used, other similarities would not be repeated. The chip stack structure 600 includes a substrate 611, a first horizontal conductive line 612, a first chip 610, a first insulating layer 613, a second horizontal conductive line 622, a second chip 620, a second insulating layer 623 and a vertical conductive line 630.

The second chip 620 is disposed on the first insulating layer 613. The first horizontal conductive line 612 is disposed in the substrate 611. The second horizontal conductive line 622 is disposed in the first insulating layer 613. The vertical conductive line 630 connects the first horizontal conductive line 612 and the second horizontal conductive line 622.

Figure 9A:
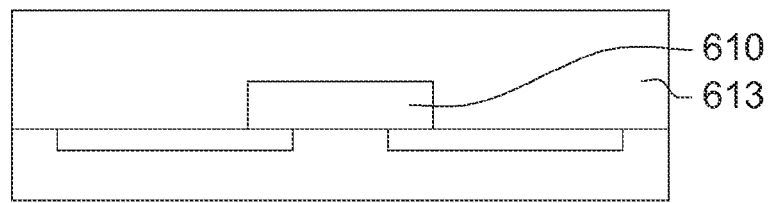
FIGS. 9A to 9F show a manufacturing method of the chip stack structure of FIG. 8.

Please referring to FIGS. 9A to 9F, a manufacturing method of the chip stack structure 600 of FIG. 8 is shown. Referring to FIG. 9A, the first chip 610 is provided. Referring to FIGS. 9B to 9F, the second chip 620 is stacked on the first chip 610 and the vertical conductive line 630 is formed.

In detail, referring to FIG. 9A, the steps of FIG. 9A are similar to the steps of FIGS. 4A to 4D and do no be repeated.

Figure 9B:
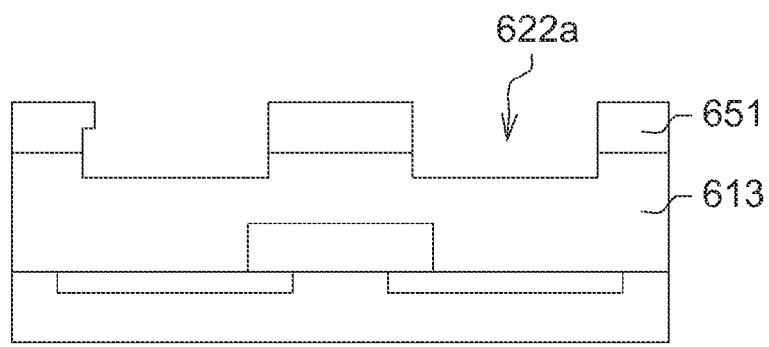

Then, referring to FIG. 9B, the first insulating layer 613 is etched to form a concave 622a by taking a patterned photo-resister layer 651 as a mask.

Figure 9C:
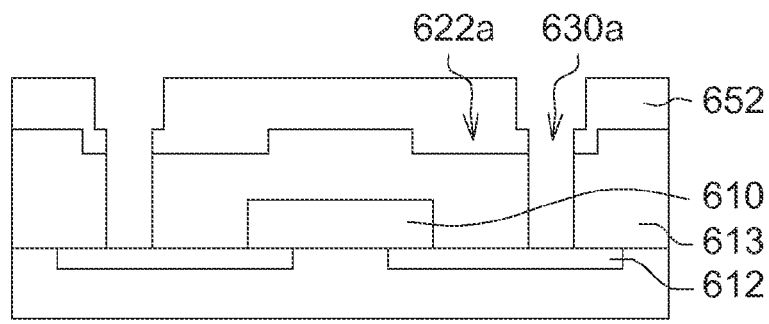

Afterwards, referring to FIG. 9C, the first insulating layer 613 is etched to form a vertical hole 630a by taking another patterned photo-resister layer 652 as a mask.

Figure 9D:
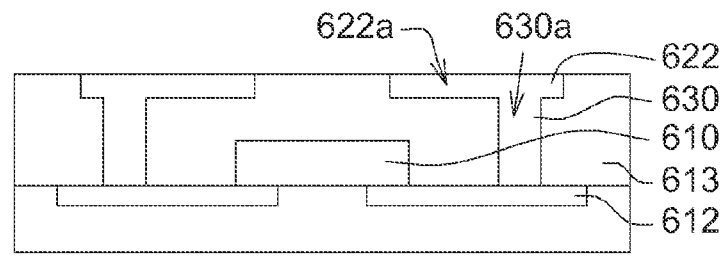

Then, referring to FIG. 9D, the vertical conductive line 630 and the second horizontal conductive line 622 are formed in the vertical hole 630a and the concave 622a respectively. The second horizontal conductive line 622 is disposed at the surface of the first insulating layer 613. The vertical conductive line 630 connects the first horizontal conductive line 612 and the second horizontal conductive line 622.

Figure 9E:
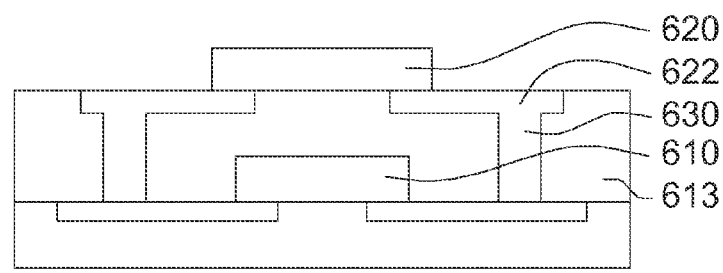

Afterwards, referring to FIG. 9E, the second chip 620 is disposed on the first insulating layer 613, such that the second chip 620 electrically connects to the second horizontal conductive line 622.

Figure 9F:
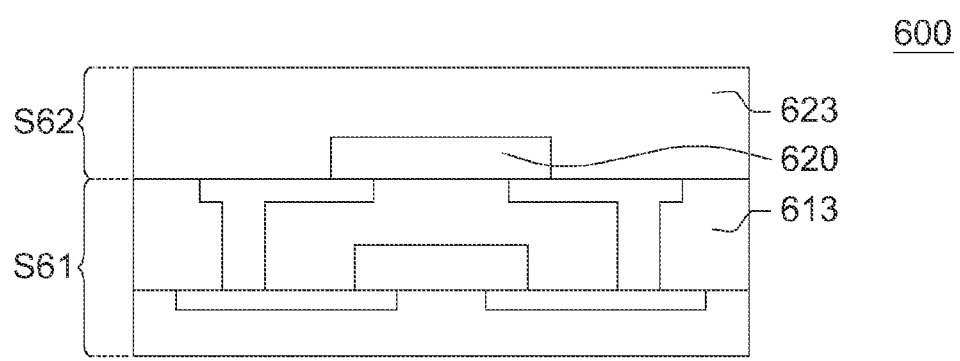

Then, referring to FIG. 9F, the second insulating layer 623 is formed to cover the first insulating layer 613 and the second chip 620.

Another chip stack structure 600 can be formed by the steps of FIGS. 9A to 9F. Only two stacks S61, S62 are taken as an example in FIGS. 9A to 9F. However, more than two stacks can be formed by the similar steps.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip stack structure, comprising:
a first chip;
a second chip, disposed above the first chip;
a vertical conductive line, electrically connected to the first chip and the second chip, wherein the vertical conductive line is disposed at the outside of a projection area of the first chip and the second chip;
a first substrate, wherein the first chip is disposed on the first substrate;
a first horizontal conductive line, disposed in the first substrate, wherein the first horizontal conductive line connects the first chip and the vertical conductive line;
a first insulating layer, covering the first substrate and the first chip;
a second substrate, wherein the second chip is disposed on the second substrate;
a second horizontal conductive line, disposed in the second substrate, wherein the second horizontal conductive line connects the second chip and the vertical conductive line; and
a second insulating layer, covering the second substrate and the second chip.

2. The chip stack structure according to claim 1, wherein the material of the first substrate, the second substrate, the first insulating layer and the second insulating layer is silicon, polymer or silicon oxide.

3. The chip stack structure according to claim 1, wherein the surfaces of the first insulating layer and the second insulating layer are flat.

4. The chip stack structure according to claim 1, wherein the vertical conductive line penetrates the second insulating layer, the second substrate and the first insulating layer.

5. The chip stack structure according to claim 1, wherein the size of the first substrate is substantially equal to that of the second substrate, the first insulating layer and the second insulating layer.

6. The chip stack structure according to claim 1, wherein the first chip and the second chip are overlapped.

* * * * *